United States Patent
Ting et al.

(10) Patent No.: US 8,928,029 B2
(45) Date of Patent: Jan. 6, 2015

(54) SINGLE-BAND AND DUAL-BAND INFRARED DETECTORS

(71) Applicant: California Institute of Technology, Pasadena, CA (US)

(72) Inventors: David Z. Ting, Arcadia, CA (US); Sarath D. Gunapala, Stevenson Ranch, CA (US); Alexander Soibel, South Pasadena, CA (US); Jean Nguyen, Los Angeles, CA (US); Arezou Khoshakhlagh, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 109 days.

(21) Appl. No.: 13/712,122

(22) Filed: Dec. 12, 2012

(65) Prior Publication Data

US 2013/0146998 A1 Jun. 13, 2013

Related U.S. Application Data

(60) Provisional application No. 61/569,375, filed on Dec. 12, 2011.

(51) Int. Cl.
*H01L 29/74* (2006.01)
*H01L 31/02* (2006.01)
*H01L 31/109* (2006.01)

(52) U.S. Cl.
CPC ........ *H01L 31/02016* (2013.01); *H01L 31/109* (2013.01)
USPC .................. 257/107; 257/12; 257/17; 257/87; 257/183; 257/E33.076

(58) Field of Classification Search
CPC ............ H01L 31/109; H01L 31/02016; H01L 51/0013; H01L 51/0059; H01L 51/5012; H01L 51/0037; H01L 51/0062; H01L 51/007; H01L 51/0094; H01L 51/56; H01L 51/0004; H01L 51/0067
USPC ............... 257/12, 17, 87, 107, 110, 183, 431, 257/E33.076

See application file for complete search history.

(56) References Cited

U.S. PATENT DOCUMENTS

| 4,679,063 | A | 7/1987 | White |
| 6,226,152 | B1 | 5/2001 | Tanaka et al. |

(Continued)

FOREIGN PATENT DOCUMENTS

| WO | 2005004243 | 1/2005 |
| WO | 2008061141 | 5/2008 |

OTHER PUBLICATIONS

Gautam et al. "Performance improvement of longwave infrared photodetector based on type-II InAs/GaSb superlattices using unipolar current blocking layers", Applied Physics Letters, 2010, vol. 96, pp. 231107-1-231107-3.

(Continued)

*Primary Examiner* — Michelle Mandala
(74) *Attorney, Agent, or Firm* — KPPB LLP (57) ABSTRACT

Bias-switchable dual-band infrared detectors and methods of manufacturing such detectors are provided. The infrared detectors are based on a back-to-back heterojunction diode design, where the detector structure consists of, sequentially, a top contact layer, a unipolar hole barrier layer, an absorber layer, a unipolar electron barrier, a second absorber, a second unipolar hole barrier, and a bottom contact layer. In addition, by substantially reducing the width of one of the absorber layers, a single-band infrared detector can also be formed.

10 Claims, 6 Drawing Sheets

(56) References Cited

U.S. PATENT DOCUMENTS

| | | |
|---|---|---|
| 6,433,354 B1 | 8/2002 | Kuan et al. |
| 6,455,908 B1 | 9/2002 | Johnson et al. |
| 7,442,599 B2 | 10/2008 | Maa et al. |
| 7,687,871 B2 | 3/2010 | Maimon |
| 7,795,640 B2 | 9/2010 | Klipstein |
| 7,928,473 B2 | 4/2011 | Klipstein |
| 8,022,390 B1 | 9/2011 | Kim et al. |
| 8,217,480 B2 | 7/2012 | Ting et al. |
| 2003/0064248 A1* | 4/2003 | Wolk et al. ............ 428/690 |
| 2007/0215900 A1 | 9/2007 | Maimon |
| 2008/0111152 A1* | 5/2008 | Scott et al. ............ 257/188 |
| 2009/0084958 A1* | 4/2009 | Vogt ............ 250/338.4 |
| 2009/0127462 A1 | 5/2009 | Gunapala et al. |
| 2009/0256231 A1 | 10/2009 | Klipstein |
| 2010/0006822 A1 | 1/2010 | Ting et al. |
| 2010/0072514 A1 | 3/2010 | Ting et al. |
| 2010/0155777 A1 | 6/2010 | Hill et al. |
| 2010/0230720 A1 | 9/2010 | Wicks |
| 2011/0037097 A1 | 2/2011 | Scott et al. |
| 2012/0145996 A1 | 6/2012 | Ting et al. |
| 2013/0062593 A1 | 3/2013 | Jones et al. |

OTHER PUBLICATIONS

Hill et al., "Demonstration of large format mid-wavelength infrared focal plane arrays based on superlattice and BIRD detector structures", Infrared Physics & Technology, 2009, vol. 52, pp. 348-352.

Kim et al., "Mid-IR focal plane array based on type-II InAs/GaSb strain layer superlattice detector with nBn design", Applied Physics Letters, 2008, vol. 92, pp. 183502-1-183502-3.

Klipstein, ""XBn" Barrier Photodetectors for High Sensitivity and High Operating Temperature Infrared Sensors", Proc. of SPIE, 2008, vol. 6940, pp. 69402U-1-69402U-12.

Lackner et al., "Growth of InAsSb/InAs MQWs on GaSb for mid-IR photodetector applications", Journal of Crystal Growth, 2009, vol. 311, pp. 3563-3567.

Lackner et al., "InAsSb and InPSb Materials for Mid Infrared Photodetectors", Proceedings, 2010, IPRM, 4 pgs.

Lackner et al., "Strain balanced InAs/InAsSb superlattice structures with optical emission to 10 um", Applied Physics Letters, 2009, vol. 95, pp. 081906-1-081906-3.

Maimon et al., "nBn detector, an infrared detector with reduced dark current and higher operating temperatures", Applied Physics Letters, 2006, vol. 89, 1511091-1511093.

Plis et al., "Lateral diffusion of minority carriers in InAsSb-based nBn detectors", Applied Physics Letters, 2010, vol. 97, pp. 123503-1-123503-3.

Ting et al., "A high-performance long wavelength superlattice complementary barrier infrared detector", Applied Physics Letters, 2009, vol. 95, pp. 023508-1023508-3.

\* cited by examiner

SINGLE-BAND AND DUAL-BAND INFRARED DETECTORS

CROSS-REFERENCE TO RELATED APPLICATIONS

The current application claims priority to U.S. Provisional Application No. 61/569,375, filed Dec. 12, 2011, the disclosure of which is incorporated herein by reference.

STATEMENT OF FEDERAL FUNDING

The invention described herein was made in the performance of work under a NASA contract, and is subject to the Provisions of Public Law 96-517 (35 USC 202) in which the Contractor has elected to retain title.

FIELD OF THE INVENTION

The current invention is directed to an infrared detector; and more particularly to a bias-switchable dual-band or single-band infrared detector.

BACKGROUND OF THE INVENTION

HgCdTe-based bias-switchable dual-band (two-color) infrared detectors have been reported in the literature since the early 1990s. The typical device structure consists of two back-to-back infrared photodiodes, each designed to detect a particular color band. The two diodes are monolithically integrated, typically in an n-P-N (capital letters denote material layers with wider band gap) three-layer design or an n-p-P-N four-layer design. (See, e.g., J. M. Arias, et al., *J. Appl. Phys.* 70, 4620-4622 (1991); E. R. Blazejewski, et al., *J. Vac. Sci. Technol. B*10, 1626-1632 (1992); and M. B. Reine, et al., *J. Electron. Mater.* 24, 669-679 (1995), the disclosures of each of which are incorporated herein by reference. The topic has been well documented in books and review articles. (See, e.g., A. Rogalski, *Infrared Physics & Technology* 41, 231-238 (2000), the disclosure of which is incorporated herein by reference.)

Recently, type-II superlattices (e.g., InAs/GaSb or InAs/GaInSb) have emerged as viable alternatives to HgCdTe for infrared detection. The performance of type-II superlattice based infrared detectors can be enhanced by using heterostructure designs such as the nBn, pBp, double heterostructure (DH), or complementary barrier infrared detector (CBIRD). (See, e.g., A. M. White, U.S. Pat. No. 4,679,063; S. Maimon and G. W. Wicks, *Appl. Phys. Lett.* 89(15) 151109 (2006); S. Maimon, U.S. Pat. No. 7,687,871 B2; J. L. Johnson, et al., *Appl. Phys. Lett.* 80(2) 1116-1127 (1996); B.-M. Nguyen, et al., *Appl. Phys. Lett.* 93(12) 123502 (2008); and D. Z.-Y. Ting, et al., *Appl. Phys. Lett.* 95, 023508 (2009), the disclosures of each of which are incorporated herein by reference.) These device structures make use of unipolar barriers, which can block one carrier type (electron or hole) but allow the un-impeded flow of the other. Type-II superlattices have also been used in bias-switchable dual-band infrared detectors. A simple method involves the two-color nBn design, where an electron-blocking (but not hole-blocking) unipolar barrier is inserted between two n-doped infrared absorbers with different energy band gaps. Dual-band nBn detectors implemented using type-II InAs/Ga(In)Sb superlattices have been reported in the literature. (See, A. Khoshakhlagh, et al., *Appl. Phys. Lett.* 91, 263504 (2007), the disclosure of which is incorporated herein by reference.)

A general concern with using n-doped type-II superlattices as infrared absorbers has to do with the unfavorable hole mobility characteristics. Semiconductor transport is controlled primarily by the properties of minority carriers, which are holes in the case of n-type material. The hole mobility of a type-II superlattice such as InAs/GaSb is generally highly anisotropic. Hole mobility is considerably lower in the direction perpendicular to the superlattice layer interfaces than in the lateral (in-plane) directions. Theoretical considerations show that this effect is more pronounced in long wavelength infrared (LWIR) superlattices than mid-wavelength infrared (MWIR) superlattices. (See, David Z. Ting, et al., *Proc. of SPIE* 7419, 74190B (2009), the disclosure of which is incorporated herein by reference.) Strong lateral diffusion of minority carriers in superlattice nBn photodetector structures has been observed experimentally. (See, E. Plis, et al., *Appl. Phys. Lett.* 93, 123507 (2008), the disclosure of which is incorporated herein by reference.) The fact that holes have more difficulty diffusing along the perpendicular direction toward the collecting contact than diffusing laterally can be very problematic in a focal plane array (FPA). For an FPA with reticulated pixels (physically isolated pixels, defined by etching), lateral diffusion transports the minority carriers to the exposed pixel sidewalls, where recombination could take place readily. In a planar-processed FPA with non-reticulated pixels, strong lateral diffusion means that minority carriers can spread easily to neighboring pixels, resulting in image blurring.

An alternative approach is to use a dual-band pBp design instead. A pBp detector structures consists of a hole-blocking (but not electron blocking) unipolar barrier sandwiched between two p-doped infrared absorbing superlattices with different energy band gaps. In type-II superlattices such as InAs/GaSb, electron mobility is high and nearly isotropic. The problems associated with unfavorable anisotropic hole mobilities in n-type superlattice infrared absorbers are greatly reduced in pBp structures where electrons are minority carriers. However, the pBp structure has its own problems. Unlike the nBn design which is capable of reducing electron surface leakage current (See, G. W. Wicks, G. R. Savich, J. R. Pedrazzini, and S. Maimon, "Infrared detector epitaxial designs for suppression of surface leakage current," *Proc. of SPIE* 7608, 760822 (2010), the disclosure of which is incorporated herein by reference.), the pBp design is susceptible to this mechanism. Consider a reticulated detector pixel with exposed sidewalls. A type-II superlattice containing InAs layers is likely to develop an accumulation of electrons on the sidewall surface (InAs surface Fermi level is pinned in the conduction band, independent of doping type.). This turns the sidewall surface into n-type. Since there are no electron barriers in a pBp structure, electron surface leakage current flow un-impeded from one electrode to the other. This can result in a sizable dark current that reduces detector sensitivity.

Accordingly, a need exists for a practical bias-switchable dual-band infrared detector.

SUMMARY OF THE INVENTION

The current invention is directed to bias-switchable dual-band infrared detectors based on a back-to-back heterojunction diode design.

In one embodiment the invention is directed to a bias-switchable dual-band infrared detector including:
   first and second contact structures;
   a first unipolar hole barrier layer adjacent to said first contact layer, and a second unipolar hole barrier layer adjacent said second contact layer;

a first absorber layer adjacent to said first unipolar hole barrier layer, and a second absorber layer adjacent to said second unipolar hole barrier layer;
a unipolar electron barrier layer disposed between said first and second absorber layers; and
wherein the electron unipolar barrier is configured to block the flow of minority carriers between the first and second absorber layers.

In another embodiment, the first contact layer, first unipolar hole barrier layer and first absorber layers are configured such that there is minimal conduction band edge offset among them, wherein the second contact layer, second unipolar hole barrier layer and second absorber layers are configured such that there is minimal conduction band edge offset among them, and wherein the first absorber layer, unipolar electron barrier layer and second absorber layers are all configured such that the valence band edges of said layers are closely aligned.

In still another embodiment, both of the absorber layers are p-type doped.

In yet another embodiment, both of the contact layers are n-type doped.

In still yet another embodiment, the first and second unipolar hole barrier layers are configured to block the flow of majority carriers from the absorber.

In still yet another embodiment, the unipolar hole barrier layers are selected from the group consisting of undoped, p-type doped, and have a graded doping profile that varies from p-type near the adjacent absorber layer to n-type adjacent the contact layer.

In still yet another embodiment, one grouping of layers selected from the group consisting of the first absorber layer and first contact layers, the second absorber layer and second contact layers, the first hole barrier layer and first contact layers, and the second hole barrier layer and second contact layers are formed from the same material.

In still yet another embodiment, the width of one of either the first or second absorber layers is reduced such that the infrared detector operates as a single-band detector, wherein the detection characteristics of the detector are solely determined by the thicker of the absorber layers. In one such embodiment, the gain of the detector is dependent on the height of the unipolar electron barrier layer.

In another embodiment, the invention is directed to a bias-switchable dual-band infrared detector including:
first and second contact structures;
a first unipolar electron barrier layer adjacent to said first contact layer, and a second unipolar electron barrier layer adjacent said second contact layer;
a first absorber layer adjacent to said first unipolar electron barrier layer, and a second absorber layer adjacent to said second unipolar electron barrier layer;
a unipolar hole barrier layer disposed between said first and second absorber layers; and
wherein the hole unipolar barrier is configured to block the flow of minority carriers between the first and second absorber layers.

In another embodiment, the first contact layer, first unipolar hole barrier layer and first absorber layers are configured such that there is minimal conduction band edge offset among them, wherein the second contact layer, second unipolar hole barrier layer and second absorber layers are configured such that there is minimal conduction band edge offset among them, and wherein the first absorber layer, unipolar electron barrier layer and second absorber layers are all configured such that the valence band edges of said layers are closely aligned.

In still another embodiment, both of the absorber layers are n-type doped.

In yet another embodiment, both of the contact layers are p-type doped.

In still yet another embodiment, the first and second unipolar electron barrier layers are configured to block the flow of majority carriers from the absorber.

In still yet another embodiment, the unipolar electron barrier layers are one of undoped, n-type doped, or have a graded doping profile that varies from n-type near the adjacent absorber layer to p-type adjacent the contact layer.

In still yet another embodiment, one grouping of layers selected from the group consisting of the first absorber layer and first contact layers, the second absorber layer and second contact layers, the first electron barrier layer and first contact layers, and the second electron barrier layer and second contact layers are formed from the same material.

In still yet another embodiment, the width of one of either the first or second absorber layers is reduced such that the infrared detector operates as a single-band detector, wherein the detection characteristics of the detector are solely determined by the thicker of the absorber layers.

In still yet another embodiment, the gain of the detector is dependent on the height of the unipolar hole barrier layer.

In yet another embodiment, the invention is directed to a bias-switchable single-band infrared detector including:
first and second contact structures;
a first unipolar hole barrier layer adjacent to said first contact layer, and a second unipolar hole barrier layer adjacent said second contact layer;
a first absorber layer adjacent to said first unipolar hole barrier layer, and a second absorber layer adjacent to said second unipolar hole barrier layer;
a unipolar electron barrier layer disposed between said first and second absorber layers;
wherein the electron unipolar barrier is configured to block the flow of minority carriers between the first and second absorber layers; and
wherein the width of one of either the first or second absorber layers is reduced such that the infrared detector operates as a single-band detector, wherein the detection characteristics of the detector are solely determined by the thicker of the absorber layers.

In still yet another embodiment, the invention is directed to a bias-switchable single-band infrared detector including:
first and second contact structures;
a first unipolar electron barrier layer adjacent to said first contact layer, and a second unipolar electron barrier layer adjacent said second contact layer;
a first absorber layer adjacent to said first unipolar electron barrier layer, and a second absorber layer adjacent to said second unipolar electron barrier layer;
a unipolar hole barrier layer disposed between said first and second absorber layers;
wherein the hole unipolar barrier is configured to block the flow of minority carriers between the first and second absorber layers; and
wherein the width of one of either the first or second absorber layers is reduced such that the infrared detector operates as a single-band detector, wherein the detection characteristics of the detector are solely determined by the thicker of the absorber layers.

BRIEF DESCRIPTION OF THE DRAWINGS

These and other features and advantages of the present invention will be better understood by reference to the following detailed description when considered in conjunction with the accompanying data, wherein.

DETAILED DESCRIPTION OF THE INVENTION

Bias-switchable dual-band infrared are described in the embodiments set forth herein. As will be described embodiments of the infrared detectors are based on a back-to-back heterojunction diode design. In these embodiments, the detector consists generally of a sequential structure that includes:
- a top contact layer,
- a unipolar hole barrier layer,
- an absorber layer,
- a unipolar electron barrier,
- a second absorber,
- a second unipolar hole barrier, and
- a bottom contact layer.

In addition, as will be discussed in greater detail below, by substantially reducing the width of one of the absorber layers, a single-band infrared detector can also be formed.

Definitions

An absorber layer or structure, as used herein is a layer of a semiconducting material or materials having a bandgap structure where photons impinging on the material with sufficient energy excite electrons across the material's bandgap to produce photocurrents.

A unipolar barrier layer or structure, as used herein, is a heterostructure that can block one carrier type (electron or hole) but allows the substantially un-impeded flow of the other.

A hole unipolar barrier layer or structure, as used herein, is a heterostructure that is capable of blocking holes from a lower band gap layer to an adjacent higher band gap barrier layer, but that allows the unimpeded flow of electrons across said barrier.

A contact layer or structure, as used herein, is a structure used to place the absorber layers into electrical contact with and between the detector circuitry and the other functioning heterostructures.

It should be understood that although the above-definitions describe single layers, and though the material might be a single monolithic structure, it may also be a layered structure, such as a periodic superlattice or combination of the superlattices, or a graded structure. Superlattices with complex supercells containing more than two distinct layers are also possible. In all cases, the layer widths and materials compositions could be chosen to yield a desired energy band gap, absorption strength, and strain balance for the particular application. In addition, for the contact layers it should be understood that other types of so-called "broken-gap junctions" contact and buffer layers may also be used with the absorbers of the instant application.

Device Structures

Figure 1:
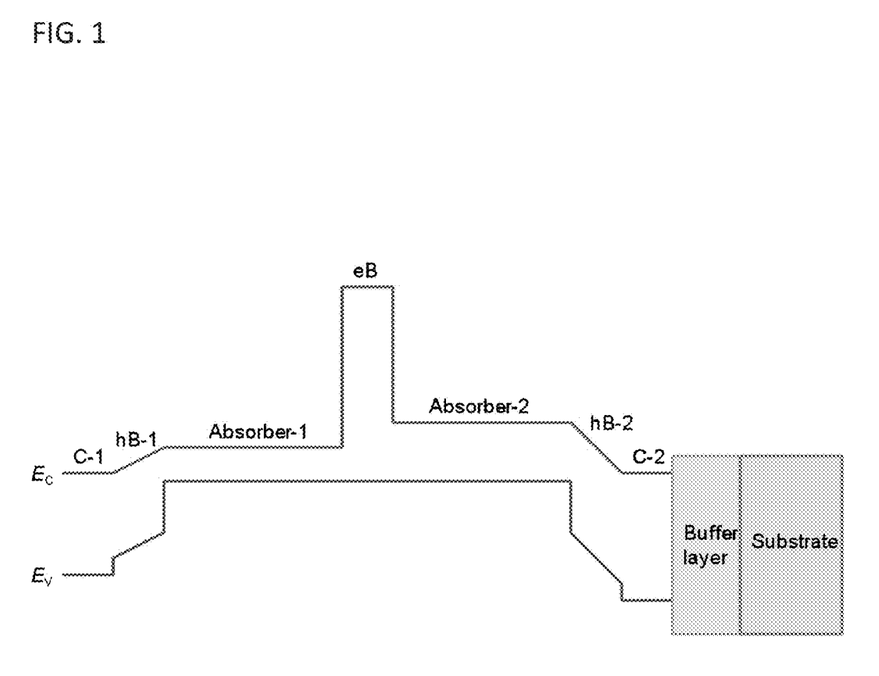
FIG. 1 provides a schematic of one embodiment of a bias-switchable dual-band infrared detector made in accordance with the current invention.

Turning now to some embodiments of the device structure, as shown schematically in FIG. 1, in some embodiments the detector structure consists essentially of a top contact layer (C-1), a unipolar hole barrier layer (hB-1), an absorber layer (Absorber 1), a unipolar electron barrier (eB), a second absorber (Absorber 2), a second unipolar hole barrier (hB-2), and a bottom contact layer (C-2), where the conduction edge ($E_c$) and valence edge ($E_v$) are shown in an energy band diagram. Although not essential, it is preferable to have close conduction band edge alignment among C-1, hB-1, and Absorber 1 (and separately, among C-2, hB-2, and Absorber 2), and close valence band edge alignment among Absorber 1, eB, and Absorber 2. To accomplish this, as defined above, these structures could be engineered with gradings and/or superlattice structures to ensure better band edge alignment. (A description of some of these types of structures is provided in U.S. Pat. No. 8,217,480, the disclosure of which is incorporated herein by reference.)

In some embodiments, both of the absorber layers are doped p-type, while both of the contact layers are doped n-type. Accordingly, the device structure can be described less formally as consisting of two back-to-back heterojunction p-I-N diodes, connected in the middle by a shared electron blocking unipolar barrier. Note that a major difference between this device design and conventional nBn or pBp designs is that the electron unipolar barrier in the middle of the present device serves to block minority carriers. This is in clear contrast to the majority carrier blocking barrier used in conventional nBn and pBp detectors. In contrast, as shown in the figures, a pair of hole-blocking unipolar barriers (hB-1 and hB-2) surrounding the absorber layers are provided in the embodiments of the current device to block the flow of majority carriers.

In terms of the construction of the layers themselves, as described in the definitions above, the doping and layer widths of the hole barriers can be adjusted to minimize tunneling leakage current without blocking photocurrent. For instance, the hole barriers can be left undoped, or have a graded doping profile that varies from lightly p-type near the absorber side to lightly n-type near the contact side.

Figure 2:
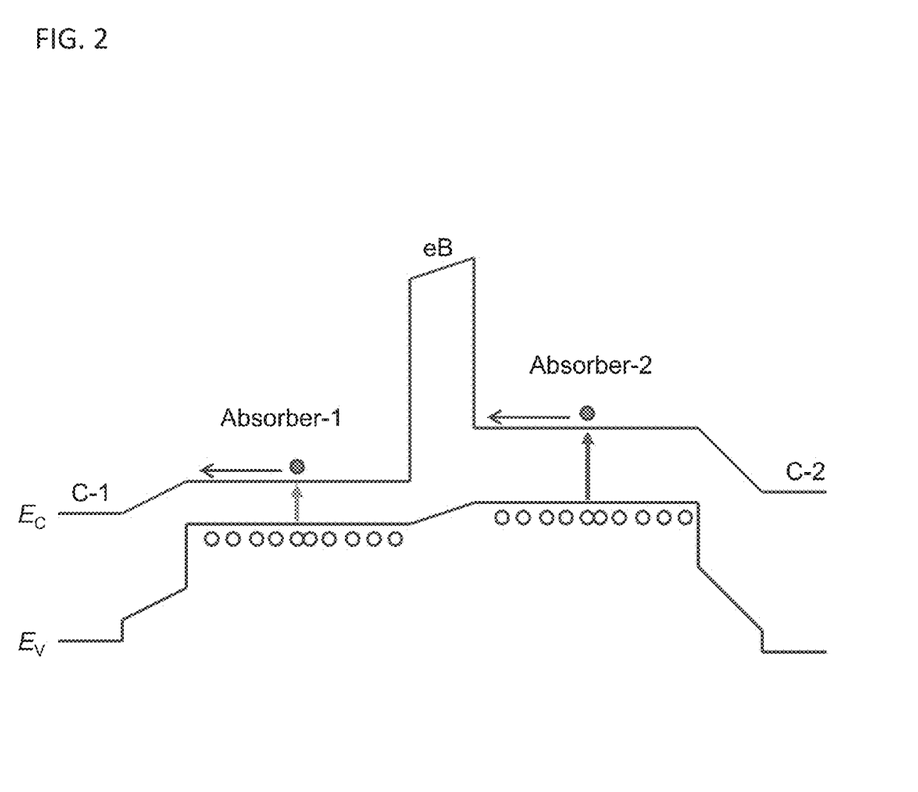
FIG. 2 provides a schematic energy band diagram for a bias-switchable dual-band infrared detector in accordance with the current invention.

The schematic energy band diagram in FIG. 2 illustrates how dual-band detection works in embodiments of the inventive devices. It depicts the case where the device is under a positive bias applied to the top contact (C-1). Photo-excited electron-hole pairs are created in both Absorber 1 and Absorber 2. The photo-excited electrons (minority carriers) in Absorber 1 can flow toward the top contact (C-1) and be collected. The photo-excited holes (majority carriers) will repel other holes by Coulomb interaction (dielectric relaxation) into Absorber 2, where the excess holes are recombined with electrons injected from the bottom contact (C-2). On the other hand, photo-excited electrons in Absorber 2 are blocked by the electron barrier. These photo-excited electrons are prevented from traveling towards the top contact to be collected; they will remain in the Absorber 2 region and eventually recombine with the excess majority carriers (holes). Thus, under positive top contact bias, only Absorber 1 can contribute to the photocurrent (Absorber 1 active; Absorber 2 inactive). Similarly, under negative top-contact bias, only Absorber 2 contributes to the photocurrent. Since Absorber 1 and Absorber 2 have different band gaps (and hence different cutoff wavelengths), by changing the biasing direction, it is possible to detect different infrared spectral bands. Note that regardless of the biasing direction, in the current device the electron barrier serves to block electron surface leakage current.

Figure 3:
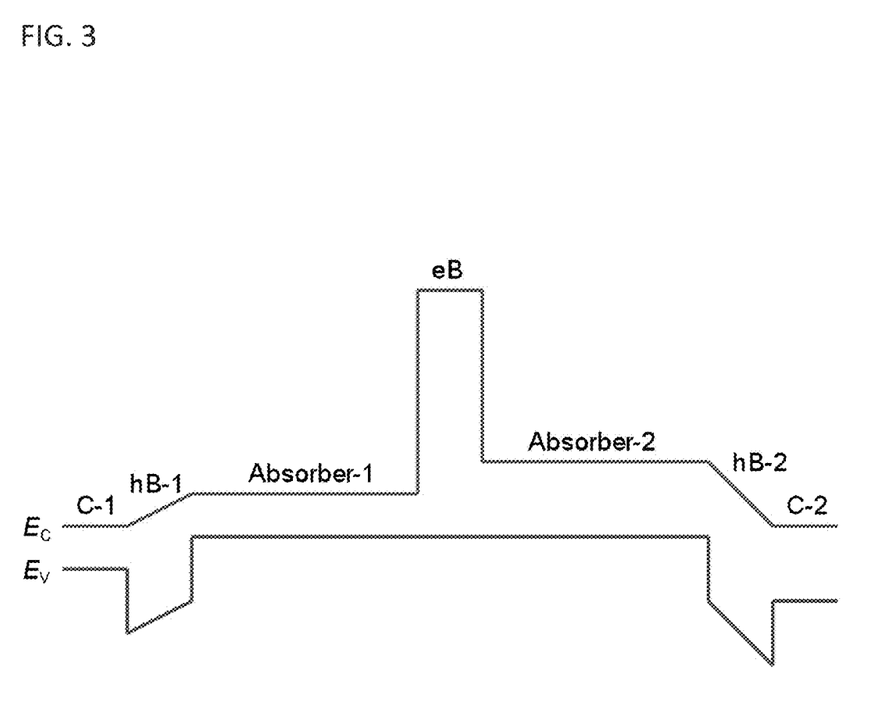
FIG. 3 provides a schematic of another embodiment of a bias-switchable dual-band infrared detector made in accordance with the current invention.
Figure 4:
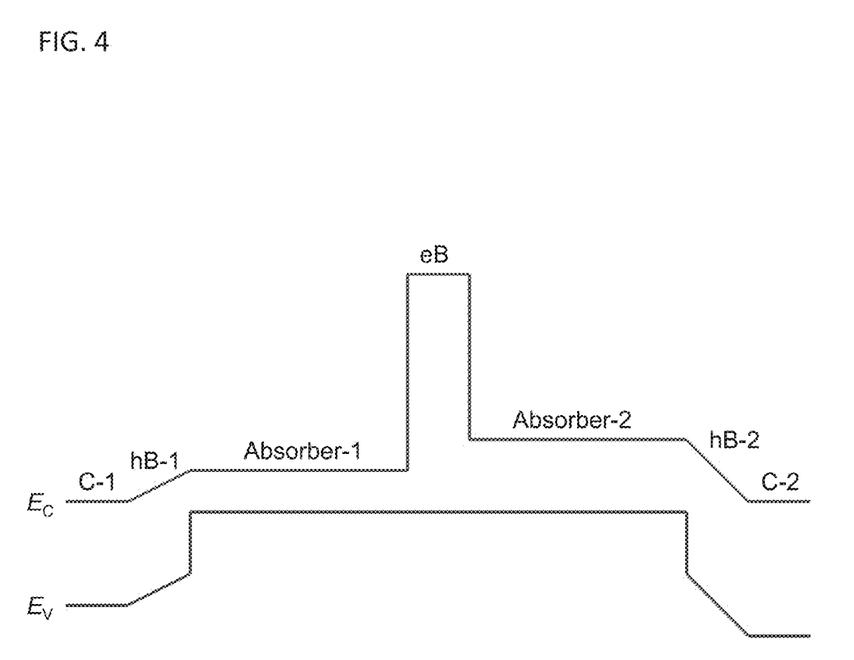
FIG. 4 provides a schematic of yet another embodiment of a bias-switchable dual-band infrared detector made in accordance with the current invention.

Although one embodiment of the invention is shown in FIG. 1, above, it should be understood that many variations of the basic device structure are possible. For instance, Absorber 1 and C-1 could be made from the same material (the same applies to Absorber 2 and C-2), as shown in FIG. 3. Also, C-1 could be made from the same material as hB-1, provided good electrical contact can be made (the same applies to C-2 and hB-2), as shown in FIG. 4.

Figure 5:
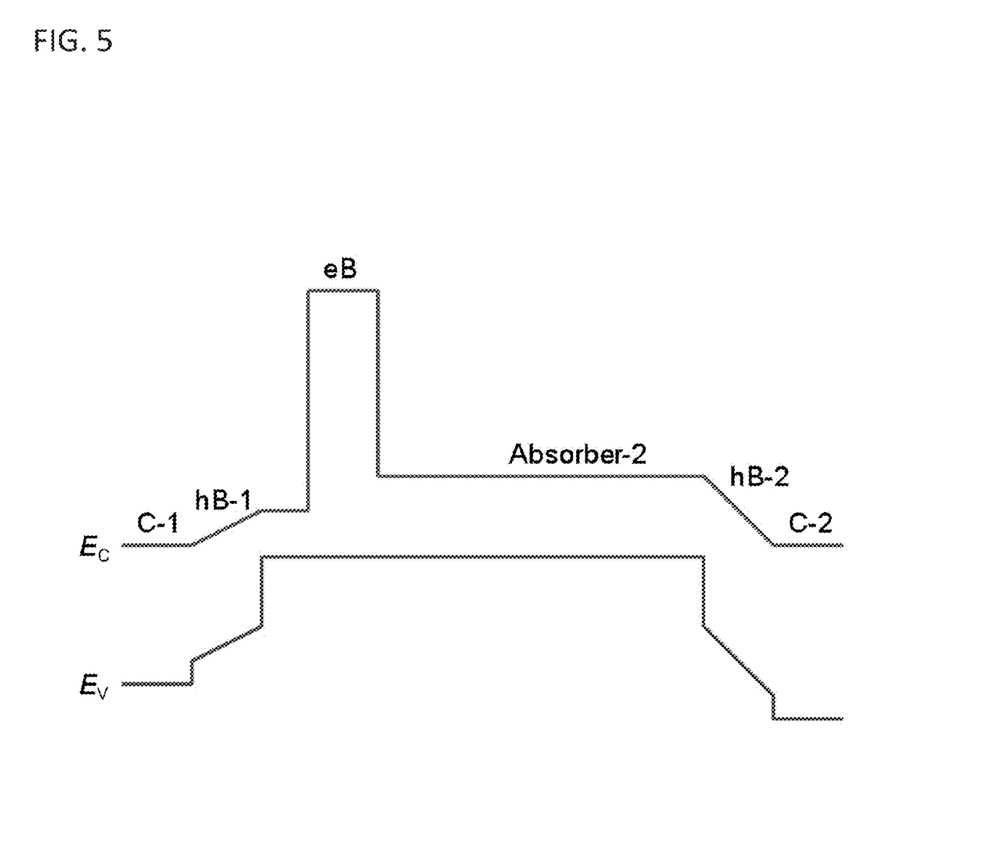
FIG. 5 provides a schematic of one embodiment of a single-band infrared detector made in accordance with the current invention.

Alternatively, it is also possible to use this design for a single-band detector, simply by reducing the width of one of the absorbers. FIG. 5 illustrates the case where the Absorber 1 is shortened, so that the infrared detection characteristics are determined only by the properties of Absorber 2. It should also be noted that the electron barrier height could be adjusted to change the gain in the device (in the limited case of no electron barrier, the structure is very much like a phototransistor structure, where the gain could be substantially larger than unity). This applies primarily to the single-band case, since in the dual-band case it is desirable for the electron barrier to always block minority carriers from the inactive absorber.

Figure 6:
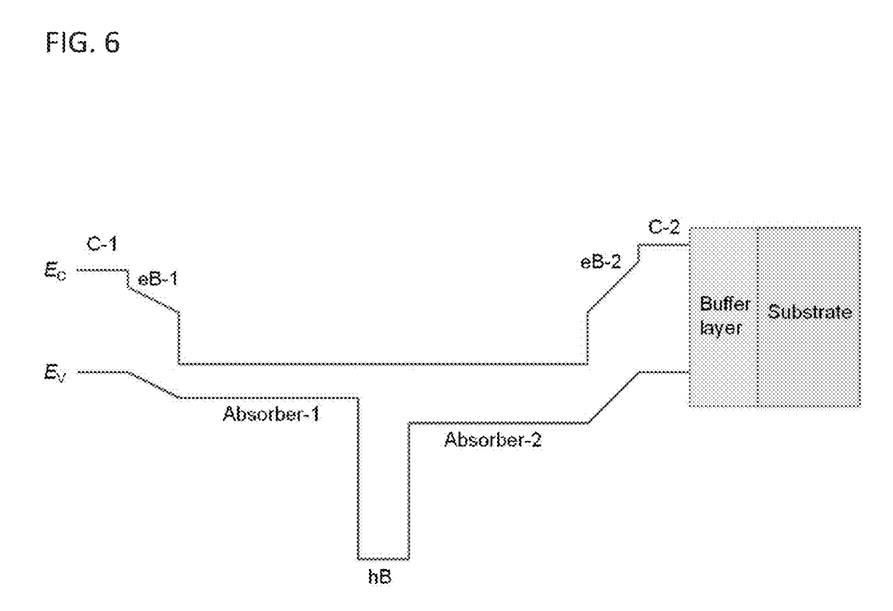
FIG. 6 provides a schematic of another embodiment of a bias-switchable dual-band infrared detector made in accordance with the current invention.

In addition, it is also possible to have an equivalent but complementary structure, as depicted in FIG. 6, in which the identities of the barrier layers are reversed. Such a structure would consist essentially of a top contact layer (C-1), a unipolar electron barrier layer (eB-1), an absorber layer (Absorber 1), a unipolar hole barrier (hB), a second absorber (Absorber 2), a second unipolar electron barrier (eB-2), and a bottom contact layer (C-2). Although not essential, it is preferable to have close valence band edge alignment among C-1, eB-1, and Absorber 1 (and separately, among C-2, eB-2, and Absorber 2), and close conduction band edge alignment among Absorber 1, hB, and Absorber 2.

Exemplary Embodiments

The person skilled in the art will recognize that additional embodiments according to the invention are contemplated as being within the scope of the foregoing generic disclosure, and no disclaimer is in any way intended by the foregoing, non-limiting examples.

Using the published CBIRD structure as a guide, a specific implementation of the bias-switchable dual-band detector described here could use InAs/GaSb superlattices with different energy band gaps for Absorber 1, eB, and Absorber 2, InAs/AlSb superlattices for hB-1, hB-2, C-1, and C-2. (See, e.g., D. Z.-Y. Ting, et al., *Appl. Phys. Lett.* 95, 023508 (2009), the disclosure of which is incorporated herein by reference.) Alternatively, C-1 and C-2 could be replaced by InAs/GaSb superlattices.

Doctrine of Equivalents

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A bias-switchable dual-band infrared detector comprising:
   first and second contact structures;
   a first unipolar hole barrier layer adjacent to said first contact layer, and a second unipolar hole barrier layer adjacent said second contact layer;
   a first absorber layer adjacent to said first unipolar hole barrier layer, and a second absorber layer adjacent to said second unipolar hole barrier layer;
   a unipolar electron barrier layer disposed between said first and second absorber layers; and
   wherein the electron unipolar barrier is configured to block the flow of minority carriers between the first and second absorber layers.

2. The bias-switchable dual-band infrared detector of claim 1 wherein the first contact layer, first unipolar hole barrier layer and first absorber layers are configured such that there is minimal conduction band edge offset among them, wherein the second contact layer, second unipolar hole barrier layer and second absorber layers are configured such that there is minimal conduction band edge offset among them, and wherein the first absorber layer, unipolar electron barrier layer and second absorber layers are all configured such that the valence band edges of said layers are closely aligned.

3. The bias-switchable dual-band infrared detector of claim 1 wherein both of the absorber layers are p-type doped.

4. The bias-switchable dual-band infrared detector of claim 1 wherein both of the contact layers are n-type doped.

5. The bias-switchable dual-band infrared detector of claim 1 wherein the first and second unipolar hole barrier layers are configured to block the flow of majority carriers from the absorber layers.

6. The bias-switchable dual-band infrared detector of claim 1 wherein the unipolar hole barrier layers are selected from the group consisting of undoped, p-type doped, and have a graded doping profile that varies from p-type near the adjacent absorber layer to n-type adjacent the contact layer.

7. The bias-switchable dual-band infrared detector of claim 1 wherein one grouping of layers selected from the group consisting of the first absorber layer and first contact layers, the second absorber layer and second contact layers, the first hole barrier layer and first contact layers, and the second hole barrier layer and second contact layers are formed from the same material.

8. The bias-switchable dual-band infrared detector of claim 1 wherein the width of one of either the first or second absorber layers is reduced such that the infrared detector operates as a single-band detector, wherein the detection characteristics of the detector are solely determined by the thicker of the absorber layers.

9. The single-band infrared detector of claim 8 wherein the gain of the detector is dependent on the height of the unipolar electron barrier layer.

10. A bias-switchable dual-band infrared detector comprising:
    first and second contact structures;
    a first unipolar electron barrier layer adjacent to said first contact layer, and a second unipolar electron barrier layer adjacent said second contact layer;

a first absorber layer adjacent to said first unipolar electron barrier layer, and a second absorber layer adjacent to said second unipolar electron barrier layer;

a unipolar hole barrier layer disposed between said first and second absorber layers; and wherein the hole unipolar barrier is configured to block the flow of minority carriers between the first and second absorber layers; and wherein the width of one of either the first or second absorber layers is reduced such that the infrared detector operates as a single-band detector, wherein the detection characteristics of the detector are solely determined by the thicker of the absorber layers.

* * * * *